(12) United States Patent
Yang et al.

(10) Patent No.: US 9,842,631 B2
(45) Date of Patent: Dec. 12, 2017

(54) MITIGATING EXTERNAL INFLUENCES ON LONG SIGNAL LINES

(71) Applicant: NVIDIA Corporation, Santa Clara, CA (US)

(72) Inventors: Ge Yang, Dublin, CA (US); Hwong-Kwo Lin, Palo Alto, CA (US); Xi Zhang, San Jose, CA (US); Jiani Yu, Fremont, CA (US); Haiyan Gong, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 34 days.

(21) Appl. No.: 13/715,991

(22) Filed: Dec. 14, 2012

(65) Prior Publication Data

US 2014/0169108 A1 Jun. 19, 2014

(51) Int. Cl.
*G11C 7/12* (2006.01)
*G11C 11/4091* (2006.01)

(52) U.S. Cl.
CPC ............ *G11C 7/12* (2013.01); *G11C 11/4091* (2013.01)

(58) Field of Classification Search
CPC .............................. G11C 7/12; G11C 11/4091
USPC ........................................ 365/203, 202, 190
See application file for complete search history.

(56) References Cited

U.S. PATENT DOCUMENTS

| | | | |
|---|---|---|---|
| 4,256,411 A | 3/1981 | Podosek | |
| 4,730,279 A * | 3/1988 | Ohtani | G11C 11/419 365/190 |
| 4,852,064 A * | 7/1989 | Kim | G11C 11/419 365/189.07 |
| 4,910,714 A | 3/1990 | Hartgring | |
| 5,157,631 A * | 10/1992 | Shimogawa | G11C 11/419 365/189.06 |
| 5,297,090 A * | 3/1994 | McClure | G11C 11/419 365/189.15 |
| 5,305,264 A * | 4/1994 | Takahashi | G11C 11/419 365/154 |
| 5,604,705 A * | 2/1997 | Ackland et al. | 365/205 |

(Continued)

FOREIGN PATENT DOCUMENTS

| | | |
|---|---|---|
| DE | 69129895 | 12/1998 |
| JP | 2004214997 | 7/2004 |
| WO | WO2004077659 | 9/2004 |

OTHER PUBLICATIONS

Segura, et al.; "CMOS Electronics: How it Works, How It Fails" ; Apr. 2004 ; pp. 102-103 ; Wiley-IEEE Press.

*Primary Examiner* — Vanthu Nguyen

(57) ABSTRACT

Mitigating external influences on long signal lines. In accordance with an embodiment of the present invention, a column of a memory array includes first and second transistors configured to pull up the bit line of the column. The column includes a third transistor configured to selectively pull up the bit line of the column responsive to a level of the inverted bit line of the column and a fourth transistor configured to selectively pull up the inverted bit line of the column responsive to a level of the bit line of the column. The column further includes fifth and sixth transistors configured to selectively pull up the bit line and inverted bit line of the column responsive to the clamp signal and a seventh transistor configured to selectively couple the bit line of the column and the inverted bit line of the column responsive to the clamp signal.

17 Claims, 4 Drawing Sheets

(56) References Cited

U.S. PATENT DOCUMENTS

| | | | |
|---|---|---|---|
| 5,821,791 A | 10/1998 | Gaibotti et al. | |
| 5,903,171 A | 5/1999 | Shieh | |
| 5,933,373 A * | 8/1999 | Takahashi | G11C 7/12 365/189.06 |
| 5,973,972 A * | 10/1999 | Kwon et al. | 365/203 |
| 6,075,733 A * | 6/2000 | Brown | 365/203 |
| 6,098,145 A * | 8/2000 | Huang | 711/1 |
| 6,160,746 A * | 12/2000 | Park et al. | 365/203 |
| 6,310,501 B1 | 10/2001 | Yamashita | |
| 6,396,309 B1 | 5/2002 | Zhao et al. | |
| 6,442,721 B2 | 8/2002 | Whetsel | |
| 6,472,920 B1 | 10/2002 | Cho et al. | |
| 6,563,730 B1 * | 5/2003 | Poplevine | G11C 11/419 365/154 |
| 6,580,411 B1 | 6/2003 | Kubota et al. | |
| 6,630,853 B1 | 10/2003 | Hamada | |
| 6,714,060 B2 | 3/2004 | Araki | |
| 6,747,485 B1 | 6/2004 | Suryanarayana et al. | |
| 7,057,421 B2 | 6/2006 | Shi et al. | |
| 7,196,552 B2 | 3/2007 | Zhou | |
| 7,200,057 B2 * | 4/2007 | Pineda De Gyvez et al. | 365/203 |
| 7,304,903 B2 | 12/2007 | Mukhopadhyay et al. | |
| 7,359,266 B2 * | 4/2008 | Song et al. | 365/202 |
| 7,405,606 B2 | 7/2008 | Kok et al. | |
| 7,418,641 B2 | 8/2008 | Drake et al. | |
| 7,760,117 B1 | 7/2010 | Chou | |
| 8,009,489 B2 * | 8/2011 | Zhang et al. | 365/189.16 |
| 8,064,271 B2 * | 11/2011 | Houston | G11C 7/12 365/189.06 |
| 8,189,416 B2 | 5/2012 | Kim | |
| 8,446,791 B2 * | 5/2013 | Pham et al. | 365/189.16 |
| 8,742,796 B2 | 6/2014 | Dally et al. | |
| 8,817,562 B2 * | 8/2014 | Ramamurthy | G11C 11/419 365/154 |
| 9,435,861 B2 | 9/2016 | Elkin | |
| 2004/0160244 A1 | 8/2004 | Kim | |
| 2004/0243896 A1 | 12/2004 | Jaber et al. | |
| 2005/0040856 A1 | 2/2005 | Ramaraju et al. | |
| 2005/0108604 A1 | 5/2005 | Wong | |
| 2006/0049852 A1 | 3/2006 | Park et al. | |
| 2007/0028157 A1 | 2/2007 | Drake et al. | |
| 2007/0146033 A1 | 6/2007 | Pesci | |
| 2008/0086667 A1 | 4/2008 | Chen et al. | |
| 2008/0195337 A1 | 8/2008 | Agarwal et al. | |
| 2008/0270862 A1 | 10/2008 | Drake et al. | |
| 2010/0102890 A1 | 4/2010 | Stratz et al. | |
| 2010/0109707 A1 | 5/2010 | Srivastava et al. | |
| 2010/0332924 A1 | 12/2010 | Ziaja et al. | |
| 2011/0066904 A1 | 3/2011 | Lackey | |

\* cited by examiner

400

490

MITIGATING EXTERNAL INFLUENCES ON LONG SIGNAL LINES

RELATED APPLICATION

This application is related to U.S. Pat. No. 7,649,762, entitled "Area Efficient High Performance Memory Cell," assigned to the assignee of the present invention and having a common inventor, which is hereby incorporated herein by reference in its entirety.

FIELD OF INVENTION

Embodiments of the present invention relate to the field of integrated circuit design and manufacture. More specifically, embodiments of the present invention relate to systems and methods for mitigating external influences on long signal lines.

BACKGROUND

A variety of integrated circuits comprise substantially parallel long lines coupling similar circuits. For example, many memory arrays comprise long bit lines coupling a plurality of memory cells in parallel that are physically close to one another. The physical characteristics of such lines, e.g., physical proximity and parallel layout, may lead to unwanted electrical coupling between and among such lines.

FIG. 1 (conventional art) illustrates an exemplary memory array 100, in accordance with the conventional art. Memory array 100 comprises a plurality of word lines, e.g., WL0 through WL255. Word line 170 (WL255) is one exemplary word line. Memory array 100 also comprises a plurality of bit lines, e.g., BL0 through BL255. Bit lines 110 (BL0) and 130 (BL1) are exemplary bit lines. Memory array 100 further comprises a plurality of inverted bit lines, e.g., BLB0 ("bit line bar") through BLB255. Inverted bit lines 120 (BLB0) and 140 (BLB1) are exemplary inverted bit lines.

Located at the intersection of each word line and bit line is a memory cell, e.g., memory cell 150 and memory cell 160. In exemplary memory array 100, a cell (150, 160) may be considered to include both a bit line and an inverted bit line, although that is not required. In the case of exemplary memory array 100, a word line, e.g., word line 170 is asserted and the value of the plurality of memory cells is read on the bit lines, e.g., bit lines 110 and 130, and read on the inverted bit lines, e.g., inverted bit lines 120 and 140. For example, exemplary memory array 100 is illustrated to produce a b'00' as the first two bits of word line 170 (WL255). Similarly, exemplary memory array 100 stores b'10' as the first two bits of word line 180 (WL0).

It is to be appreciated that bit lines 110 and 130 and inverted bit lines 120 and 140 are not required to operate as binary signals, although that is possible. The bit lines and inverted bit lines may operate as differential pairs, with a signal value determined by a voltage difference between a bit line and inverted bit line of the same column. It is to be further appreciated that the voltage difference may have greater than a single bit of resolution, e.g., the single memory cell may store more than a single bit of information.

The discharge speed, and hence access time of a bit line is a function of the voltage and current waveforms on the bit line and/or inverted bit line, and in turn depends on the loading on the bit line and inverted bit line. The bit lines and inverted bit lines comprise long, parallel structures, and are susceptible to undesirable influences from one another, including, for example, capacitive coupling between a bit line and inverted bit line within a cell, e.g., 110 and 120, as well as coupling between lines of one cell and lines of a nearby cell, e.g., between inverted bit line 120 and bit line 130. Other factors, including, for example, ground bounce, may also unduly influence bit lines and/or inverted bit lines.

Unfortunately, such influences may cause a memory array to function undesirably slowly, e.g., to allow sufficient duration for such influences to settle, or cause disadvantageous erroneous operation, e.g., reading an incorrect value.

SUMMARY OF THE INVENTION

Therefore, what is needed are systems and methods for mitigating external influences on long signal lines. What is additionally needed are systems and methods for mitigating external influences on long signal lines that mitigate interference originating within a column of long signal lines. A further need is for systems and methods for mitigating external influences on long signal lines that mitigate interference originating from a nearby -a column of long signal lines. A still further need exists for systems and methods for mitigating external influences on long signal lines that are compatible and complementary with existing systems and methods of integrated circuit design, manufacturing and test. Embodiments of the present invention provide these advantages.

In accordance with a first embodiment of the present invention, an electronic circuit includes a first transistor configured to selectively pull up a bit line of a memory array responsive to a clamp signal and a second transistor configured to selectively couple the bit line and an inverted bit line of a same cell of the memory array responsive to the clamp signal. The electronic circuit may include a third transistor configured to selectively pull up the inverted bit line responsive to the clamp signal.

In accordance with a second embodiment of the present invention, an electronic circuit includes a first transistor configured to selectively pull up a bit line of a memory array responsive to a level of an inverted bit line of a same cell of the memory array and a second transistor configured to selectively pull up the inverted bit line of the memory array responsive to a level of the inverted bit line of the same cell.

In accordance with a third embodiment of the present invention, an integrated circuit memory includes a plurality of memory cells for storing a value. The plurality of memory cells are configured as a plurality of columns of memory cells. The memory cells of each column are coupled by a bit line and an inverted bit line.

At least one of the plurality of columns further includes a first transistor configured to pull up the bit line of the column and a second transistor configured to pull up the inverted bit line of the column. The column also includes a third transistor configured to selectively pull up the bit line of the column responsive to a level of the inverted bit line of the column and a fourth transistor configured to selectively pull up the inverted bit line of the column responsive to a level of the bit line of the column. The column further includes a fifth transistor configured to selectively pull up the bit line of the column responsive to a clamp signal, a sixth transistor configured to selectively pull up the inverted bit line of the column responsive to the clamp signal and a seventh transistor configured to selectively couple the bit line of the column and the inverted bit line of the column responsive to the clamp signal.

BRIEF DESCRIPTION OF THE DRAWINGS

The accompanying drawings, which are incorporated in and form a part of this specification, illustrate embodiments} of the invention and, together with the description, serve to explain the principles of the invention. Unless otherwise noted, the drawings are not drawn to scale.

DETAILED DESCRIPTION

Figure 1:
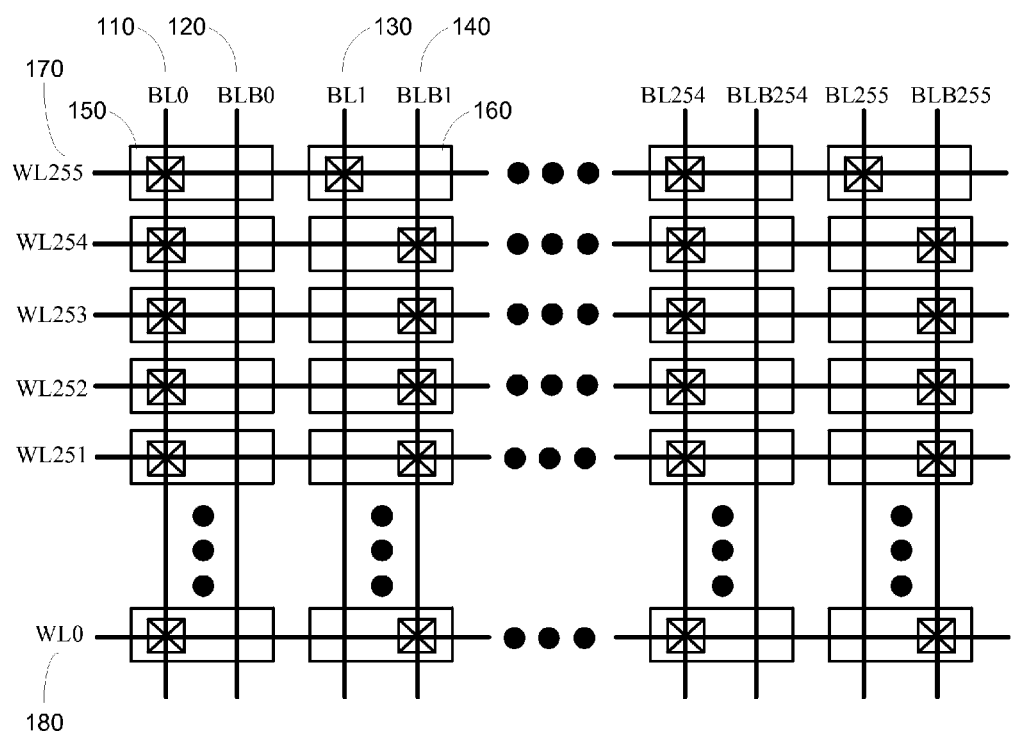
FIG. 1 illustrates an exemplary memory array, in accordance with the conventional art.

Reference will now be made in detail to various embodiments of the invention, mitigating external influences on long signal lines, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "processing" or "forming" or "roughening" or "filling" or "accessing" or "performing" or "generating" or "adjusting" or "creating" or "executing" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments in accordance with the present invention are illustrated by p-channel metal oxide field effect transistors, pMOSFETs, also known as PMOS devices. Embodiments in accordance with the present invention are well suited to NMOS embodiments, and such embodiments are considered within the scope of the present invention.

Embodiments in accordance with the present invention are illustrated in terms of a read only memory (ROM) array, e.g., as illustrated in FIG. 1 (conventional art). Embodiments in accordance with the present invention are well suited to use in conjunction with the disclosures of U.S. Pat. No. 7,649,762, entitled "Area Efficient High Performance Memory Cell," incorporated herein by reference in its entirety. It is to be appreciated that embodiments in accordance with the present invention are also well suited to a variety of other circuit types, including other types of memory, e.g., random access memory (RAM), programmable read only memory (PROM), erasable programmable read only memory (EPROM), "flash" memory, and the like. Embodiments in accordance with the present invention are further well suited to a variety of non-memory circuits.

Mitigating External Influences on Long Signal Lines

Figure 2:
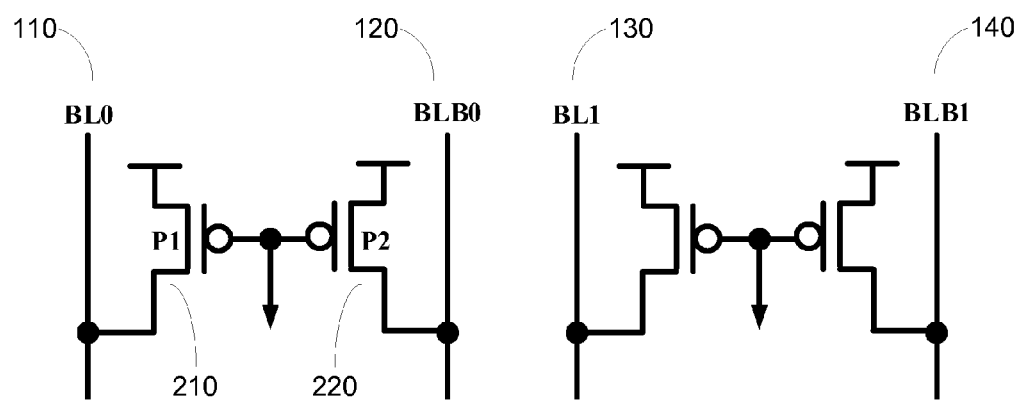
FIG. 2 illustrates a pull up circuit, in accordance with embodiments of the present invention.

FIG. 2 illustrates a pull up circuit 200, in accordance with embodiments of the present invention. Pull up circuit 200 comprises p-type metal oxide semiconductor (PMOS) device 210 coupled to bit line 110 (BL0) and PMOS device 220 coupled to inverted bit line 120 (BLB0). PMOS devices 210 and 220 should be duplicated for every pair of bit line and inverted bit line, e.g., every "column" of a memory array. PMOS devices 210 and 220 are weak devices which pull up the bit line pair. PMOS devices 210 and 220 are always on. They operate to compensate for leakage current and stabilize a bit line and/or inverted bit line subject to undesirable influences from one or more adjacent lines.

The source of PMOS device 210 is coupled to a power supply voltage, e.g., Vdd. The drain of PMOS device 210 is coupled to bit line 110 (BL0). The source of PMOS device 220 is coupled to a power supply voltage, e.g., Vdd. The drain of PMOS device 220 is coupled to inverted bit line 120 (BLB0). The gates of PMOS devices 210 and 220 are coupled to a ground reference, e.g., Vss, rendering such devices always on (when power is applied).

PMOS devices 210 and 220 should be substantially weaker, e.g., be characterized as having less drive current, than standard devices that make up the circuitry of the memory array. For example, PMOS devices 210 and 220 should be overcome by the actions of a memory cell. PMOS devices 210 and 220 may be constructed for their desired strength by any suitable technique, e.g., patterned with a decreased width to length (W/L) ratio. PMOS devices 210 and 220 may also represent a stack of multiple devices that results in a cumulative "weak" drive current.

Figure 3:
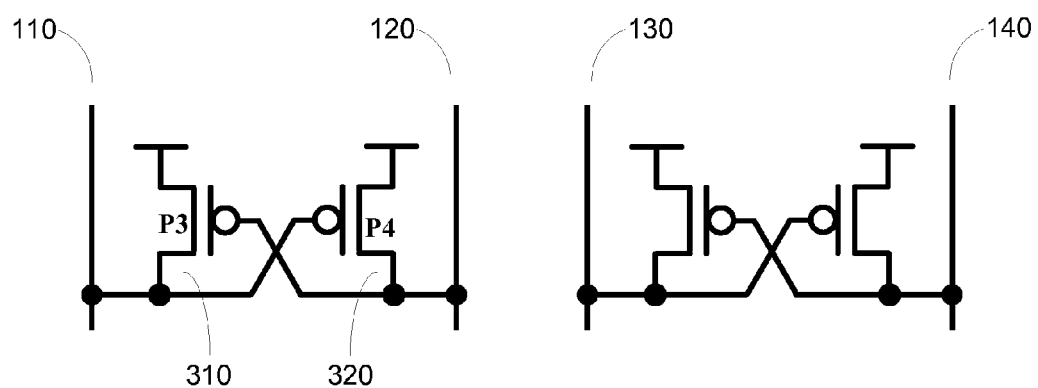
FIG. 3 illustrates a cross coupling circuit, in accordance with embodiments of the present invention.

FIG. 3 illustrates a cross coupling circuit 300, in accordance with embodiments of the present invention. Cross coupling circuit 300 comprises p-type metal oxide semiconductor (PMOS) device 310 and PMOS device 320. PMOS devices 310 and 320 should be duplicated for every bit line and inverted bit line pair, e.g., every "column" of a memory array.

The source of PMOS device 310 is coupled to a power supply voltage, e.g., Vdd. The source of PMOS device 320 is coupled to a power supply voltage, e.g., Vdd. The drain of PMOS device 310 is coupled to bit line 110 (BL0) and to the gate of PMOS device 320. The drain of PMOS device 320 is coupled to inverted bit line 120 (BLB0) and to the gate of PMOS device 310. In this manner, a level on bit line 110 (BL0) controls PMOS device 320, while a level on inverted bit line 120 (BLB0) controls PMOS device 310. PMOS devices 310 and 320 may be of "normal" strength.

Cross coupling circuit 300 operates to compensate for coupling between an asserted bit line (or inverted bit line) and an inverted bit line (or bit line) in the same column. For example, inverted bit line 120 (BLB0) may be influenced by the discharge of bit line 110 (BL0), e.g., due to capacitive coupling and other factors.

Cross coupling circuit 300 operates to compensate for such coupling. In response to bit line 110 (BL0) being discharged below Vdd minus the threshold voltage of PMOS device 320, PMOS device 320 will turn on and pull inverted bit line 120 (BLB0) back up to Vdd. Meanwhile, the high level on inverted bit line 120 (BLB0) will keep PMOS device 310 off, allowing bit line 110 (BL0) to operate normally. A similar operation occurs when inverted bit line 120 (BLB0) is discharged.

Figure 4:
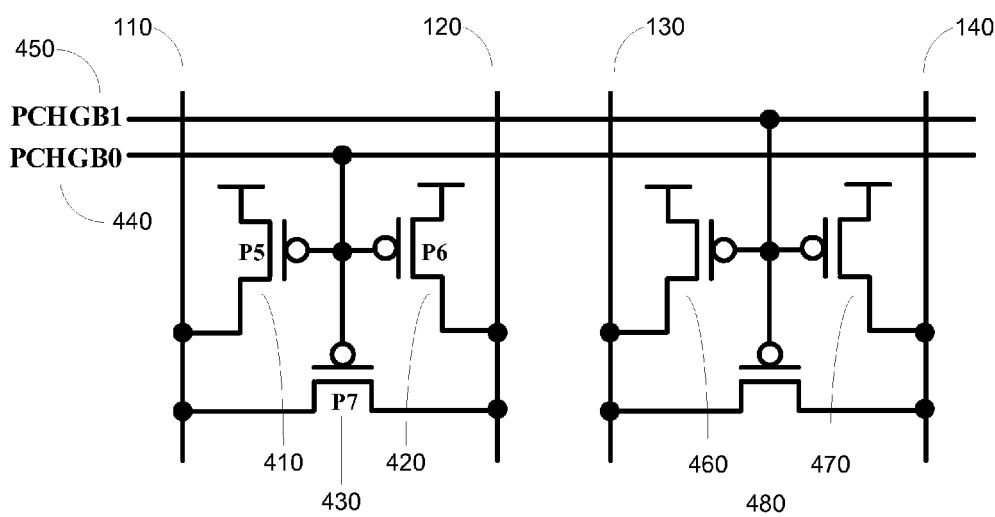
FIG. 4 illustrates a precharge/clamping circuit, in accordance with embodiments of the present invention.
Figure 4:
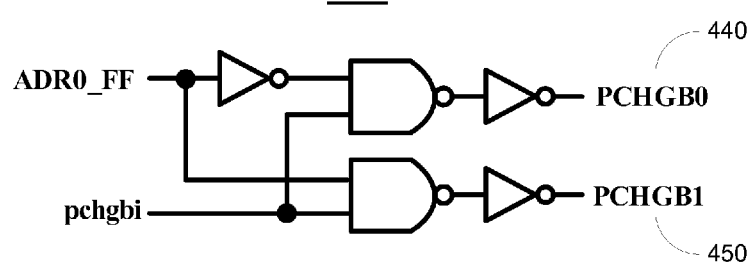

FIG. 4 illustrates a precharge/clamping circuit 400, in accordance with embodiments of the present invention. Precharge/clamping circuit 400 comprises p-type metal oxide semiconductor (PMOS) device 410, PMOS device 420 and PMOS device 430. Precharge/clamping circuit 400 should be duplicated for every pair of bit line and inverted bit line, e.g., every "column" of a memory array. FIG. 4 also illustrates logic circuit 490 for decoding precharge signals 440 (PCHGB0) and 450 (PCHGB1), where "ADR0_FF" is an address line of a column, and "pchgbi" is a global precharge signal.

The source of PMOS device 410 is coupled to a power supply voltage, e.g., Vdd. The drain of PMOS device 410 is coupled to bit line 110 (BL0). The source of PMOS device 420 is coupled to a power supply voltage, e.g., Vdd. The drain of PMOS device 420 is coupled to inverted bit line 120 (BLB0). The source and drain of PMOS device 430 are coupled to bit line 110 (BL0) and inverted bit line 120 (BLB0). The gates of PMOS devices 410, 420 and 430 are coupled to precharge signal 440 (PCHGB0). Logic circuit 490 illustrates the generation of precharge signal 440 (PCHGB0). PMOS devices 410, 420 and 430 should be relatively strong devices, e.g., they should be characterized as having a high drive current.

Similarly, PMOS devices 460, 470 and 480 form a second precharge/clamping circuit for a second column, e.g., a column comprising bit line 130 (BL1) and inverted bit line 140 (BLB1). It is appreciated that the gates of PMOS devices 460, 470 and 480 are not coupled to precharge signal 440 (PCHGB0). Rather, the gates of PMOS devices 460, 470 and 480 are coupled to a different precharge signal, precharge signal 450 (PCHGB1). Logic circuit 490 illustrates the generation of precharge signal 450 (PCHGB1).

Precharge/clamping circuit 400 has two principal functions: to precharge the selected bit lines/inverted bit lines, and to clamp the bit lines/inverted bit lines of columns that are not selected. During a precharge cycle, the precharge signals 440 (PCHGB0) and 450 (PCHGB1) are low, and PMOS devices 410 and 420 will pull bit line 110 (BL0) and inverted bit line 120 (BLB0), respectively, to Vdd.

During a read operation, responsive to a selection of column 0, precharge signal 440 (PCHGB0) will go high. Since column 0 is selected, column 1 is not selected, and consequently precharge signal 450 (PCHGB1) is low. Thus the precharge devices for column 1 (PMOS devices 460 and 470) are on and they will clamp bit line 130 (BL1) and inverted bit line 140 (BLB1) to Vdd, reducing interference to the adjacent columns, e.g., column 0.

PMOS devices 430 and 480 serve to equalize charge on a bit line and inverted bit line within a column. They have the same logic control sense as the precharge devices. When a column is not selected, e.g., the corresponding precharge signal is low, PMOS device 430 or 480 will turn on, forming a conductive path between a bit line and inverted bit line within a column. It is to be appreciated that an equalization device, e.g., PMOS device 430 or 480, should never be on when its column is selected.

In summary, during read operations, precharge/clamping circuit 400, including logic circuit 490, operates to pull up all bit lines, e.g., bit line 130, and inverted bit lines, e.g., inverted bit line 140, in all columns that are not selected. During read operations, Precharge/clamping circuit 400 also operates to equalize charge between a bit line and inverted bit line within a column, for all columns that are not selected. When precharging, precharge/clamping circuit 400 operates to pre-charge bit lines and inverted bit lines, governed by a global precharge signal, e.g., "pchgbi."

It is to be appreciated that pull up circuit 200 (FIG. 2), cross coupling circuit 300 (FIG. 3) and precharge/clamping circuit 400 (FIG. 4) are compatible and complementary, and well suited to use together. For example, pull up circuit 200 (FIG. 2) may reduce an effect of leakage current on bit lines and inverted bit lines. Cross coupling circuit 300 (FIG. 3) may reduce interference among bit lines and inverted bit lines within a memory cell. Precharge/clamping circuit 400 (FIG. 4) may reduce interference among bit lines and inverted bit lines among different memory cells. In accordance with embodiments of the present invention, a circuit may benefit by the addition of any two or all three such circuits, and such combinations are considered within the scope of the present invention.

Embodiments in accordance with the present invention are well suited to multi-level memory circuits, for example memory circuits that store more than two levels of charge and/or current that correspond to more multiple bits. For example, a memory circuit that is capable of storing and detecting, or reading, four different voltage levels in a single cell may store two bits of information in a single such cell. Due in part to the reductions in external interference facilitated by the present invention, the operation of such multi-level memory circuits may be enabled and/or improved.

Embodiments in accordance with the present invention provide systems and methods for mitigating external influences on long signal lines. In addition, embodiments in accordance with the present invention provide systems and methods for mitigating external influences on long signal lines that mitigate interference originating within a column of long signal lines. Further, embodiments in accordance with the present invention provide systems and methods for mitigating external influences on long signal lines that mitigate interference originating from a nearby a column of long signal lines. Still further, embodiments in accordance with the present invention provide systems and methods for mitigating external influences on long signal lines that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the following claims.

What is claimed is:

1. An electronic circuit comprising:
a memory array comprising a plurality of columns, wherein each column comprises a bit line and an inverted bit line;
a first transistor configured to always pull up a bit line of a column of said memory array;
a second transistor configured to always pull up an inverted bit line of said column;
a third transistor configured to selectively pull up said bit line responsive to a column specific clamp signal, wherein said column specific clamp signal is operable on only one column of said plurality of columns;
a fourth transistor configured to selectively pull up said inverted bit line responsive to said column specific clamp signal; and
wherein said column specific clamp signal is configured to be asserted when said cell is not configured to be read.

2. The electronic circuit of claim 1 further comprising:
a sixth transistor configured to selectively pull up said inverted bit line of said same cell of said memory array responsive to a level of said bit line.

3. The electronic circuit of claim 2 further comprising a seventh transistor configured to selectively couple said inverted bit line to said bit line responsive to said column specific clamp signal.

4. The electronic circuit of claim 1 wherein said third and fourth transistors are further configured to precharge said bit line and said inverted bit line prior to a read operation of said cell.

5. The electronic circuit of claim 1 wherein said column specific clamp signal is configured to be deasserted when said cell is configured to be read.

6. An integrated circuit memory comprising:
a plurality of memory cells for storing a value;
said plurality of memory cells configured as a plurality of columns of memory cells, memory cells of each column coupled by a bit line and an inverted bit line;
at least one of said plurality of columns further comprising:
a first transistor configured to always pull up said bit line of said column; and
a second transistor configured to always pull up said inverted bit line of said column;
a third transistor configured to selectively pull up said bit line of said column responsive to a clamp signal, wherein said third transistor has a greater drive current capacity than said first transistor;
a fourth transistor configured to selectively pull up said inverted bit line of said column responsive to said clamp signal, wherein said fourth transistor has a greater drive current capacity than said second transistor; and
a fifth transistor configured to selectively couple said bit line of said column and said inverted bit line of said column responsive to said clamp signal,
wherein said third, fourth, and fifth transistors are configured for control by column unique clamp signals, and
wherein said integrated circuit memory is configured so that only one of said column unique clamp signals is inactive at a time.

7. The integrated circuit memory of claim 6 wherein said clamp signal is a column specific clamp signal, specific for each column of said plurality of columns.

8. The integrated circuit memory of claim 7 wherein said column specific clamp signal is always asserted for all columns of said plurality of columns not selected.

9. The integrated circuit memory of claim 6 wherein said first, second, third, fourth, and fifth transistors are replicated for at least one other column of said memory array.

10. The integrated circuit memory of claim 6 further comprising a via connecting one of said bit line and said inverted bit line to a drain region and wherein said via determines a value stored in one of said plurality of memory cells.

11. An electronic circuit comprising:
a memory array comprising a plurality of columns, each of said plurality of columns comprising a bit line and an inverted bit line;
a plurality of first pull-up transistors coupled to each said bit line configured to always pull up said bit line;
a plurality of second pull-up transistors coupled to each said bit line configured to selectively pull up said bit line;
a fifth transistor configured to selectively couple said bit line of said column and said inverted bit line of said column responsive to said clamp signal; and
logic configured to control said plurality of second pull-up transistors to pull up all of said bit lines except a first bit line being read.

12. The electronic circuit of claim 11 wherein said logic is further configured to pull up said first bit line responsive to a second bit line being read subsequent to said first bit line being read.

13. The electronic circuit of claim 11 further comprising:
a plurality of third pull-up transistors coupled to each said inverted bit line configured to always pull up said bit line;
a plurality of fourth pull-up transistors coupled to each said inverted bit line configured to selectively pull up said bit line; and
logic configured to control said plurality of fourth pull-up transistors to pull up all of said inverted bit lines except a first inverted bit line being read.

14. The electronic circuit of claim 13 wherein said logic is further configured to pull up said first inverted bit line responsive to a second inverted bit line being read subsequent to said first inverted bit line being read.

15. The electronic circuit of claim 11 further comprising:
a plurality of fifth transistors configured to selectively couple said bit line and said inverted bit line of a column together; and
logic configured to control said plurality of fifth transistors to couple said bit line and said inverted bit line of a column together for all columns except a first column being read.

16. The electronic circuit of claim 11 wherein said memory array comprises a read only memory (ROM).

17. The electronic circuit of claim 11 further comprising a cross-coupling transistor configured to selectively pull up said bit line responsive to a level of said inverted bit line.

* * * * *